(12) United States Patent
Kagan

(10) Patent No.: US 8,515,348 B2
(45) Date of Patent: Aug. 20, 2013

(54) BLUETOOTH-ENABLE INTELLIGENT ELECTRONIC DEVICE

(75) Inventor: Erran Kagan, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 562 days.

(21) Appl. No.: 11/589,377

(22) Filed: Oct. 30, 2006

(65) Prior Publication Data
US 2007/0096765 A1 May 3, 2007

Related U.S. Application Data

(60) Provisional application No. 60/731,073, filed on Oct. 28, 2005.

(51) Int. Cl.
*H04B 7/00* (2006.01)
*G01R 21/06* (2006.01)
*G01R 11/32* (2006.01)

(52) U.S. Cl.
USPC ............................ 455/41.2; 324/142; 702/62

(58) Field of Classification Search
USPC ............... 702/62, 57, 189, 61; 709/221, 220, 709/222, 223, 228, 217
See application file for complete search history.

(56) References Cited

U.S. PATENT DOCUMENTS

| | | | |
|---|---|---|---|
| 3,656,112 A * | 4/1972 | Paull ........................ | 340/870.02 |
| 5,650,936 A | 7/1997 | Loucks et al. | |
| 5,736,847 A | 4/1998 | Van Doorn et al. | |
| 5,828,576 A | 10/1998 | Loucks et al. | |
| 5,995,911 A | 11/1999 | Hart | |
| 6,000,034 A | 12/1999 | Lightbody et al. | |
| D427,533 S | 7/2000 | Cowan et al. | |
| D429,655 S | 8/2000 | Cowan et al. | |
| D435,471 S | 12/2000 | Simbeck et al. | |
| 6,172,616 B1 * | 1/2001 | Johnson et al. .......... | 340/870.12 |
| 6,185,508 B1 | 2/2001 | Van Doorn et al. | |
| 6,186,842 B1 | 2/2001 | Hirschbold et al. | |
| D439,535 S | 3/2001 | Cowan et al. | |
| 6,236,949 B1 | 5/2001 | Hart | |
| D443,541 S | 6/2001 | Hancock et al. | |
| 6,397,155 B1 | 5/2002 | Przydatek et al. | |
| D458,863 S | 6/2002 | Harding et al. | |
| D459,259 S | 6/2002 | Harding et al. | |
| 6,493,644 B1 | 12/2002 | Jonker et al. | |
| 6,563,697 B1 | 5/2003 | Simbeck et al. | |

(Continued)

OTHER PUBLICATIONS

Xu Hong, Wang Jianhua, "An Extendable Data Engine based on OPC Spcification"; Computer Standards & Interfaecs 26 (2004) 515-525; Dec. 5, 2003.

*Primary Examiner* — Gennadiy Tsvey
(74) *Attorney, Agent, or Firm* — Gerald E. Hespos; Michael J. Porco; Matthew T. Hespos

(57) ABSTRACT

An intelligent electronic device (IED), e.g., an electrical power meter, having wireless communication capabilities, e.g., Bluetooth connectivity, for transmitting and receiving data without a hardwire connection is provided. A system and method for retrieving revenue metering data from at least one IED, e.g., a revenue meter, are also provided. The system includes at least one intelligent electronic device including a transceiver configured for receiving calculated energy consumption data from a processor and transmitting the calculated energy consumption data via a spread-spectrum frequency hopping technique; and a data collection device configured for receiving the calculated energy consumption data from the at least one intelligent electronic device in response to supplying a pairing passkey to the intelligent electronic device.

20 Claims, 5 Drawing Sheets

(56) References Cited

U.S. PATENT DOCUMENTS

| | | | | |
|---|---|---|---|---|
| 6,611,773 | B2 | 8/2003 | Przydatek et al. | |
| 6,611,922 | B2 | 8/2003 | Ozcetin et al. | |
| 6,615,147 | B1 | 9/2003 | Jonker et al. | |
| 6,636,030 | B1 | 10/2003 | Rose et al. | |
| 6,671,635 | B1 * | 12/2003 | Forth et al. | 702/61 |
| 6,671,654 | B1 | 12/2003 | Forth et al. | |
| 6,687,627 | B1 | 2/2004 | Gunn et al. | |
| 6,694,270 | B2 | 2/2004 | Hart | |
| 6,735,535 | B1 | 5/2004 | Kagan et al. | |
| 6,737,855 | B2 | 5/2004 | Huber et al. | |
| 6,745,138 | B2 | 6/2004 | Przydatek et al. | |
| 6,751,562 | B1 * | 6/2004 | Blackett et al. | 702/61 |
| 6,751,563 | B2 | 6/2004 | Spanier et al. | |
| 6,792,337 | B2 | 9/2004 | Blackett et al. | |
| 6,792,364 | B2 | 9/2004 | Jonker et al. | |
| 6,798,190 | B2 | 9/2004 | Harding et al. | |
| 6,798,191 | B1 | 9/2004 | Macfarlane et al. | |
| 6,813,571 | B2 | 11/2004 | Lightbody et al. | |
| 6,825,776 | B2 | 11/2004 | Lightbody et al. | |
| 6,853,978 | B2 | 2/2005 | Forth et al. | |
| 6,871,150 | B2 | 3/2005 | Huber et al. | |
| D505,087 | S | 5/2005 | Ricci et al. | |
| 6,944,555 | B2 | 9/2005 | Blackett et al. | |
| 6,957,158 | B1 | 10/2005 | Hancock et al. | |
| 6,961,641 | B1 | 11/2005 | Forth et al. | |
| 6,983,211 | B2 | 1/2006 | Macfarlene et al. | |
| 6,988,025 | B2 | 1/2006 | Ransom et al. | |
| 6,988,182 | B2 | 1/2006 | Teachman et al. | |
| 6,990,395 | B2 | 1/2006 | Ransom et al. | |
| 7,006,934 | B2 | 2/2006 | Jonker et al. | |
| 7,010,438 | B2 | 3/2006 | Hancock et al. | |
| 7,072,779 | B2 | 7/2006 | Hancock et al. | |
| 7,085,824 | B2 * | 8/2006 | Forth et al. | 709/221 |
| 7,089,089 | B2 | 8/2006 | Cumming et al. | |
| 7,127,328 | B2 | 10/2006 | Ransom | |
| D532,747 | S | 11/2006 | Ricci et al. | |
| 7,136,384 | B1 | 11/2006 | Wang | |
| D534,120 | S | 12/2006 | Ricci et al. | |
| 7,155,350 | B2 | 12/2006 | Kagan | |
| 7,158,050 | B2 | 1/2007 | Lightbody et al. | |
| 7,174,258 | B2 | 2/2007 | Hart | |
| 7,174,261 | B2 | 2/2007 | Gunn et al. | |
| 7,184,904 | B2 | 2/2007 | Kagan | |
| 7,188,003 | B2 | 3/2007 | Ransom et al. | |
| 7,191,076 | B2 | 3/2007 | Huber et al. | |
| 7,216,043 | B2 | 5/2007 | Ransom et al. | |
| 7,246,014 | B2 | 7/2007 | Forth et al. | |
| 7,248,977 | B2 | 7/2007 | Hart | |
| 7,248,978 | B2 | 7/2007 | Ransom | |
| 7,249,265 | B2 | 7/2007 | von Carolsfeld et al. | |
| 7,256,709 | B2 | 8/2007 | Kagan | |
| 7,271,996 | B2 | 9/2007 | Kagan et al. | |
| 7,294,997 | B2 | 11/2007 | Kagan | |
| 7,304,586 | B2 | 12/2007 | Wang et al. | |
| 7,305,310 | B2 | 12/2007 | Slota et al. | |
| 7,337,081 | B1 | 2/2008 | Kagan | |
| 2001/0010689 | A1 * | 8/2001 | Awater et al. | 370/344 |
| 2002/0054619 | A1 * | 5/2002 | Haas | 375/133 |
| 2002/0114326 | A1 | 8/2002 | Mahalingaiah | |
| 2002/0162014 | A1 | 10/2002 | Przydatek et al. | |
| 2002/0165677 | A1 | 11/2002 | Lightbody et al. | |
| 2003/0014200 | A1 | 1/2003 | Jonker et al. | |
| 2003/0065459 | A1 | 4/2003 | Huber et al. | |
| 2003/0101008 | A1 | 5/2003 | Hart | |
| 2003/0105608 | A1 | 6/2003 | Hart | |
| 2003/0132742 | A1 | 7/2003 | Harding et al. | |
| 2003/0154471 | A1 | 8/2003 | Teachman et al. | |
| 2003/0167178 | A1 * | 9/2003 | Jarman et al. | 705/1 |
| 2003/0210699 | A1 | 11/2003 | Holt, Sr. et al. | |
| 2003/0212512 | A1 | 11/2003 | Hart | |
| 2003/0220752 | A1 | 11/2003 | Hart | |
| 2004/0066311 | A1 | 4/2004 | Giles et al. | |
| 2004/0083066 | A1 * | 4/2004 | Hayes et al. | 702/62 |
| 2004/0138786 | A1 | 7/2004 | Blackett et al. | |
| 2004/0138787 | A1 | 7/2004 | Ransom et al. | |
| 2004/0138835 | A1 | 7/2004 | Ransom et al. | |
| 2004/0172207 | A1 | 9/2004 | Hancock et al. | |
| 2004/0183522 | A1 | 9/2004 | Gunn et al. | |
| 2004/0203988 | A1 * | 10/2004 | Yang | 455/522 |
| 2004/0229578 | A1 | 11/2004 | Lightbody et al. | |
| 2005/0017874 | A1 | 1/2005 | Lightbody et al. | |
| 2005/0027464 | A1 | 2/2005 | Jonker et al. | |
| 2005/0071106 | A1 | 3/2005 | Huber et al. | |
| 2005/0184881 | A1 * | 8/2005 | Dusenberry et al. | 340/870.02 |
| 2005/0210283 | A1 * | 9/2005 | Kato | 713/200 |
| 2005/0275397 | A1 | 12/2005 | Lightbody et al. | |
| 2005/0288876 | A1 | 12/2005 | Doig et al. | |
| 2005/0288877 | A1 | 12/2005 | Doig et al. | |
| 2006/0052958 | A1 | 3/2006 | Hancock et al. | |
| 2006/0071813 | A1 | 4/2006 | Kagan | |
| 2006/0077999 | A1 | 4/2006 | Kagan et al. | |
| 2006/0086893 | A1 | 4/2006 | Spanier et al. | |
| 2006/0161400 | A1 | 7/2006 | Kagan | |
| 2006/0170409 | A1 | 8/2006 | Kagan et al. | |
| 2006/0230394 | A1 | 10/2006 | Forth et al. | |
| 2006/0271244 | A1 | 11/2006 | Cumming et al. | |
| 2007/0057812 | A1 * | 3/2007 | Cornwall | 340/870.02 |
| 2007/0067119 | A1 | 3/2007 | Loewen et al. | |
| 2007/0067121 | A1 | 3/2007 | Przydatek et al. | |
| 2007/0136010 | A1 | 6/2007 | Gunn et al. | |
| 2008/0046205 | A1 | 2/2008 | Gilbert et al. | |
| 2008/0065335 | A1 | 3/2008 | Doig et al. | |

* cited by examiner

BLUETOOTH-ENABLE INTELLIGENT ELECTRONIC DEVICE

This application claims priority on U.S. Provisional Patent Appl. No. 60/731,073, filed Oct. 28, 2005.

BACKGROUND OF THE INVENTION

1. Field of the Invention

The present disclosure relates generally to intelligent electronic devices for electrical power systems, and more particularly, to an intelligent electronic device having Bluetooth wireless communication capabilities for transmitting and receiving data without a hardwire connection.

2. Description of the Related Art

Electric utility companies ("utilities") track electric usage by customers by using power meters. These meters track the amount of power consumed at a particular location. These locations range from power substations, to commercial businesses, to residential homes. The electric utility companies use information obtained from the power meter to charge its customers for their power consumption, i.e. revenue metering.

A popular type of power meter is the socket-type revenue power meter, i.e., S-base or Type S meter. As its name implies, the meter itself plugs into a socket for easy installation, removal and replacement. Traditionally, socket-type revenue meters have been employed in residential applications for monitoring energy consumption in homes.

Other meter installations include panel mounted, switchboard mounted, and circuit breaker mounted. Typically, the power meter connects between utility power lines supplying electricity and a usage point, namely a residence or commercial place of business. A power meter may also be placed at a point within the utility's power grid, e.g., in a substation, to monitor power flowing through that point for distribution, power loss, or capacity monitoring.

The challenge with revenue and panel metering is to have them read quickly. Conventionally, to read these meters, reading personnel physically connect to the meter to download information therefrom or write down the readings from a face of the meter after visually inspecting them. However, this is a time consuming process and sometimes a difficult process when the meter is in a hard-to-reach location.

Other schemes have been used in the art to bring back data via proprietary wireless systems, the systems required users to purchase highly extensive specialized systems designed to read proprietary wireless systems. The systems required users to purchase highly extensive specialized systems designed to read proprietary solutions.

Therefore, a need exists for devices, systems and methods for providing a power meter with wireless communication capabilities for transmitting data without being in physical contact with the meter.

SUMMARY OF THE INVENTION

An intelligent electronic device (IED), e.g., an electrical power meter, having Bluetooth wireless communication capabilities for transmitting and receiving data without a hardwire connection is provided. The Bluetooth speaking meter of the present disclosure auto-negotiates when someone having a Bluetooth-enabled device simply walks or drives near the meter. This allows a Bluetooth-enabled PDA or PC computer to automatically collect data quickly from the IED or meter and eliminate the need for a technician to execute code or physically read the meter. There are many applications for this in the power metering industry such as diversion metering (e.g., reading a hidden installed meter on a poll to try to catch someone stealing electric), socket-type revenue meters and installed switchboard panel meters. Using Bluetooth technology, utilities can significantly save cost and maintenance infrastructure by using off the shelf components and hand held PDAs to read meters. Thus, since costs are cut significantly, automating meter reading becomes a much more attractive alternative.

According to one aspect of the present disclosure, an intelligent electronic device is provided including at least one sensor coupled to an electric circuit configured for measuring at least one power parameter of the electrical circuit and generating at least one analog signal indicative of the at least one power parameter; at least one analog to digital converter coupled to the at least one sensor configured for receiving the at least one analog signal and converting the at least one analog signal to at least one digital signal; a processor configured for receiving the at least one digital signal and calculating energy consumption data in the electrical circuit; and a transceiver configured for receiving the calculated energy consumption data from the processor and transmitting the calculated energy consumption data via a spread-spectrum frequency hopping technique.

In another aspect, the intelligent electronic device further includes a memory for storing at least one protocol stack for enabling the spread-spectrum frequency hopping technique. In one embodiment, the at least one protocol stack is a Bluetooth protocol stack.

In another aspect, a method for collecting data from an intelligent electronic device is provided. The method includes transmitting a first request for a communication session with the intelligent electronic device; receiving a second request from the intelligent electronic device for a passkey previously stored in the intelligent electronic device; transmitting the passkey to the intelligent electronic device; and in response to passkey, receiving data from the intelligent electronic device.

In a further aspect of the present disclosure, a system for collecting data from at least one intelligent electronic device includes at least one intelligent electronic device including at least one sensor coupled to an electric circuit configured for measuring at least one power parameter of the electrical circuit and generating at least one analog signal indicative of the at least one power parameter; at least one analog to digital converter coupled to the at least one sensor configured for receiving the at least one analog signal and converting the at least one analog signal to at least one digital signal; a processor configured for receiving the at least one digital signal and calculating energy consumption data in the electrical circuit; and a transceiver configured for receiving the calculated energy consumption data from the processor and transmitting the calculated energy consumption data via a spread-spectrum frequency hopping technique; and a data collection device configured for receiving the calculated energy consumption data from the at least one intelligent electronic device in response to supplying a pairing passkey to the intelligent electronic device.

The above and other aspects, features, and advantages of the present disclosure will become more apparent in light of the following detailed description when taken in conjunction with the accompanying drawings.

DETAILED DESCRIPTION OF THE PREFERRED EMBODIMENTS

Figure 1:
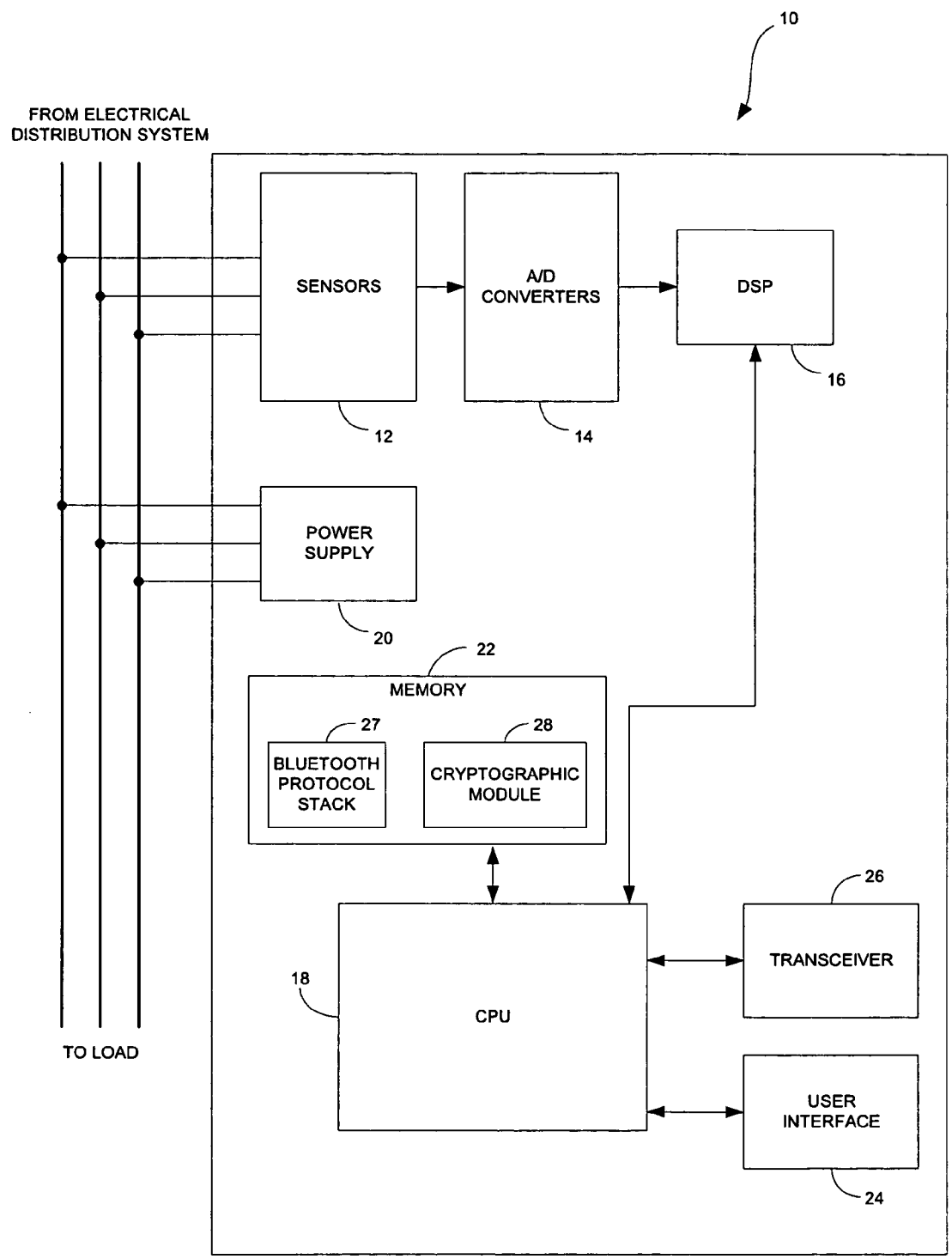
FIG. 1 is a diagram of an intelligent electronic device in accordance with an embodiment of the present disclosure.

Preferred embodiments of the present disclosure will be described herein below with reference to the accompanying drawings. In the following description, well-known functions or constructions are not described in detail to avoid obscuring the present disclosure in unnecessary detail.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering. Exemplary intelligent electronic devices are disclosed and described in the following commonly owned U.S. issued patents and published applications: U.S. patent application Ser. No. 10/146,339 entitled "METER WITH IRDA PORT" filed on May 15, 2002; U.S. patent application Ser. No. 10/958,456 entitled "METER HAVING A COMMUNICATION INTERFACE FOR RECEIVING AND INTERFACING WITH A COMMUNICATION DEVICE" filed on Oct. 5, 2004; U.S. patent application Ser. No. 11/087,438 entitled "SYSTEM AND METHOD FOR SIMULTANEOUS COMMUNICATION ON MODBUS AND DNP 3.0 OVER ETHERNET FOR ELECTRONIC POWER METER" filed on Mar. 23, 2005; U.S. patent application Ser. No. 11/109,351 entitled "SYSTEM AND METHOD FOR COMPENSATING FOR POTENTIAL AND CURRENT TRANSFORMERS IN ENERGY METERS" filed on Apr. 18, 2005; U.S. patent application Ser. No. 11/039,316 entitled "MULTIPLE ETHERNET PORTS ON POWER METER" filed on Jan. 19, 2005; U.S. patent application Ser. No. 11/003,064 entitled "CURRENT INPUTS INTERFACE FOR AN ELECTRICAL DEVICE" filed on Dec. 3, 2004; U.S. patent application Ser. No. 11/042,588 entitled "SYSTEM AND METHOD FOR CONNECTING ELECTRICAL DEVICES USING FIBER OPTIC SERIAL COMMUNICATION" filed on Jan. 24, 2005; U.S. Design Pat. No. D525,893 entitled "ELECTRONIC POWER METER" issued on Aug. 1, 2006; U.S. patent application Ser. No. 11/091,254 entitled "SYSTEM AND METHOD FOR PROVIDING UNIVERSAL ADDITIONAL FUNCTIONALITY FOR POWER METERS" filed on Mar. 28, 2005; U.S. patent application Ser. No. 11/341,802 entitled "METERING DEVICE WITH CONTROL FUNCTIONALITY AND METHOD THEREOF" filed on Jan. 27, 2006; U.S. Design patent application Ser. No. 29/224,737 entitled "WALL MOUNT ASSEMBLY" filed on Mar. 7, 2005; U.S. Design Pat. No. D526,920 entitled "ELECTRONIC METER" issued on Aug. 22, 2006; U.S. patent Continuation-in-Part application Ser. No. 11/317,227 entitled "TEST PULSES FOR ENABLING REVENUE TESTABLE PANEL METERS" filed on Dec. 22, 2005; U.S. Pat. No. 6,735,535 entitled "POWER METER HAVING AN AUTO-CALIBRATION FEATURE AND DATA ACQUISITION CAPABILITIES" issued on May 11, 2004; U.S. Pat. No. 6,636,030 entitled "REVENUE GRADE METER WITH HIGH-SPEED TRANSIENT DETECTION" issued on Oct. 21, 2002; U.S. Pat. No. 6,751,563 entitled "ELECTRONIC POWER METER" issued on Jun. 15, 2004; U.S. patent application Ser. No. 10/896,489 entitled "SYSTEM AND METHOD UTILIZING VIRTUAL SWITCHING FOR ELECTRIC PANEL METERING" filed on Jul. 22, 2004; U.S. patent application Ser. No. 10/896,521 entitled "ELECTRICAL METER INSTALLATION SYSTEM AND METHOD" filed on Jul. 22, 2004; U.S. patent application Ser. No. 10/969,713 entitled "TEST PULSES FOR ENABLING REVENUE TESTABLE PANEL METERS" filed on Oct. 20, 2004; U.S. patent application Ser. No. 10/969,592 entitled "SYSTEM AND METHOD FOR PROVIDING COMMUNICATION BETWEEN INTELLIGENT ELECTRONIC DEVICES VIA AN OPEN CHANNEL" filed on Oct. 20, 2004; and U.S. patent application Ser. No. 10/969,706 entitled "ON-LINE WEB ACCESSED ENERGY METER" filed on Oct. 20, 2004, the contents of all of which are hereby incorporated by reference in their entireties.

An intelligent electronic device (IED) 10 for monitoring and determining an amount of electrical power usage by a consumer and for providing audible and visual indications to a user is illustrated in FIG. 1. Generally, the IED 10 includes sensors 12, a plurality of analog-to-digital (A/D) converters 14 and a processing system including a central processing unit (CPU) 18 and/or a digital signal processor (DSP) 16. The sensors 12 will sense electrical parameters, e.g., voltage and current, of the incoming lines from an electrical power distribution system. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 18 or DSP 16.

The CPU 18 is configured for receiving the digital signals from the A/D converters 14 to perform the necessary calculations to determine the power usage and controlling the overall operations of the IED 10. In another embodiment, the DSP 16 will receive the digital signals from the A/D converters 14 and perform the necessary calculations to determine the power usage to free the resources of the CPU 18. It is to be appreciated that in certain embodiments the CPU 18 may perform all the functions performed by the CPU 18 and DSP 16, and therefore, in these embodiments the DSP 16 will not be utilized.

A power supply 20 is also provided for providing power to each component of the IED 10. Preferably, the power supply 20 is a transformer with its primary windings coupled to the incoming power distribution lines and having an appropriate number of windings to provide a nominal voltage, e.g., 5 VDC, at its secondary windings. In other embodiments, power is supplied from an independent source to the power supply 20, e.g., from a different electrical circuit, an uninterruptible power supply (UPS), etc.

The IED 10 of the present disclosure will include a multimedia user interface 24 for interacting with a user and for communicating events, alarms and instructions to the user. The user interface 24 will include a display for providing visual indications to the user. The display may include a touch screen, a liquid crystal display (LCD), a plurality of LED number segments, individual light bulbs or any combination of these. The display may provide the information to the user in the form of alpha-numeric lines, computer-generated graphics, videos, animations, etc. The user interface 24 will also include a speaker or audible output means for audibly producing instructions, alarms, data, etc. The speaker will be coupled to the CPU 18 via a digital-to-analog converter (D/A) for converting digital audio files stored in a memory 22 to analog signals playable by the speaker. An exemplary interface is disclosed and described in commonly owned co-pending U.S. application Ser. No. 11/589,381, entitled "INTELLIGENT ELECTRONIC DEVICE HAVING AUDIBLE AND VISUAL INTERFACE", which claims priority to U.S. Provisional Patent Appl. No. 60/731,006, filed Oct. 28, 2005, the contents of which are hereby incorporated by reference in their entireties.

The IED 10 of the present disclosure will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

In addition to storing audio and/or video files, memory 22 will store the sensed and generated data for further processing and for retrieval when called upon to be displayed at the IED 10 or from a remote location. The memory 22 includes internal storage memory, e.g., random access memory (RAM), or removable memory such as magnetic storage memory; optical storage memory, e.g., the various known types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed.

The IED 10 will include a transceiver 26 for enabling wireless communications between the IED 10 and other computing devices, e.g., a desktop computer, laptop computer, other IEDs, etc. The transceiver 26 will include an antenna for wirelessly transmitting and receiving data and a Bluetooth chipset for decoding data received by the antenna and for encoding data to be transmitted by the antenna. The antenna may be disposed internally to the IED or mounted externally on the IED. The transceiver 26 will operate in accordance with the Bluetooth standard developed by the Bluetooth Special Interest Group (SIG). Generally, the transceiver 26 will communicate on a frequency of about 2.45 gigahertz, and in a range of about 2.402 GHz to about 2.480 GHz, and employ a spread-spectrum frequency hopping technique to avoid interference with other Bluetooth-enabled devices. In this technique, the transceiver will use 79 individual, randomly chosen frequencies within a designated range, changing frequencies 1600 times every second. This technique will minimize the risk the transceiver 26 will interfere with other Bluetooth-enabled devices, e.g., other IEDs or devices within a home when the IED is used in a residential application.

In memory 22, various Bluetooth protocols and/or other short range RF (radio frequency) protocols are stored. A Bluetooth protocol stack 27 may include a link management protocol (LMP), a logical link control and application protocol (L2CAP), a service discovery protocol (SDP), RFCOMM (i.e., a serial line emulation protocol), link manager (LM), and/or the like. The LM runs on the CPU 18 in the client to manage communications between itself and other Bluetooth devices via LMP, and/or the like. After the connection of a Bluetooth client with another device, SDP enables the querying and identification of the abilities of other Bluetooth devices. L2CAP provides multiplexing, packet segmentation and reassembly of data as it is communicated between the client and other Bluetooth enabled devices. Another protocol held in memory 22 is the RFCOMM, which is a serial line emulation protocol that enables Bluetooth devices to intercommunicate by emulating a serial line. These various protocols interact to encode and decode data as given by the CPU 18 through a base band. LMP and L2CAP run directly on top of base band. RFCOMM and SDP run on top of L2CAP. It is to be appreciated that Bluetooth protocol stacks are known in the art and the above described protocol stack is in accordance with at least the IEEE 802.15.1 standard which is directed to a Wireless Personal Area Network standard based on the Bluetooth v1.1 specifications. The IEEE 802.15.1 standard also includes a medium access control and physical layer specification. The IEEE 802.15.1 standard is incorporated by reference. Furthermore, an exemplary Bluetooth protocol stack is disclosed and described in U.S. Pat. No. 7,123,878, which is hereby incorporated by reference in its entirety.

Furthermore, the memory 22 will further include a cryptographic module 28 including stored instruction signals that is executed by the CPU 18, a cryptographic processor, and/or the like. Preferably, cryptographic processor interfaces will allow for expedition of encryption and/or decryption requests by the cryptographic module 28; however, the cryptographic module 28, alternatively, may run on a conventional CPU. Preferably, the cryptographic module 28 allows for the encryption and/or decryption of provided data. Preferably, the cryptographic module 28 allows for both symmetric and asymmetric (e.g., Pretty Good Protection (PGP)) encryption and/or decryption. Preferably, the cryptographic module 28 allows conventional cryptographic techniques such as, but not limited to: digital certificates (e.g., X.509 authentication framework), digital signatures, dual signatures, enveloping, password access protection, public key management, and/or the like. Preferably, the cryptographic module 28 will facilitate numerous (encryption and/or decryption) security protocols such as, but not limited to: checksum, Data Encryption Standard (DES), Elliptical Curve Encryption (ECC), International Data Encryption Algorithm (IDEA), Message Digest 5 (MD5, which is a one way hash function), passwords, RC5 (Rivest Cipher), Rijndael, RSA (which is an Internet encryption and authentication system that uses an algorithm developed in 1977 by Ron Rivest, Adi Shamir, and Leonard Adleman), Secure Hash Algorithm (SHA), Secure Socket Layer (SSL), Secure Hypertext Transfer Protocol (HTTPS), and/or the like. The cryptographic module 28 facilitates the process of "security authorization" whereby access to a resource is inhibited by a security protocol wherein the cryptographic module 28 effects authorized access to the secured resource. The cryptographic module 28 may communicate to and/or with other modules in a module collection, including itself, and/or facilities of the like. Preferably, the cryptographic module 28 supports encryption schemes allowing for the secure transmission of information across a communications network to enable a client to engage in secure transactions if so desired by users. The cryptographic module 28 facilitates the secure accessing of resources on a client and facilitates the access of secured resources on remote systems; i.e., it may act as a client and/or server of secured resources. Most frequently, the cryptographic module 28 communicates with information servers, operating systems, other program modules, and/or the like. The cryptographic module 28 may contain, communicate, generate, obtain, and/or provide program module, system, user, and/or data communications, requests, and/or responses. In one non-limiting example embodiment, such a cryptographic tool may be provided as a library within the operating system accessible to all other modules in a module collection through an application program interface (API). The cryptographic tool enables local processing of authentication information.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2:
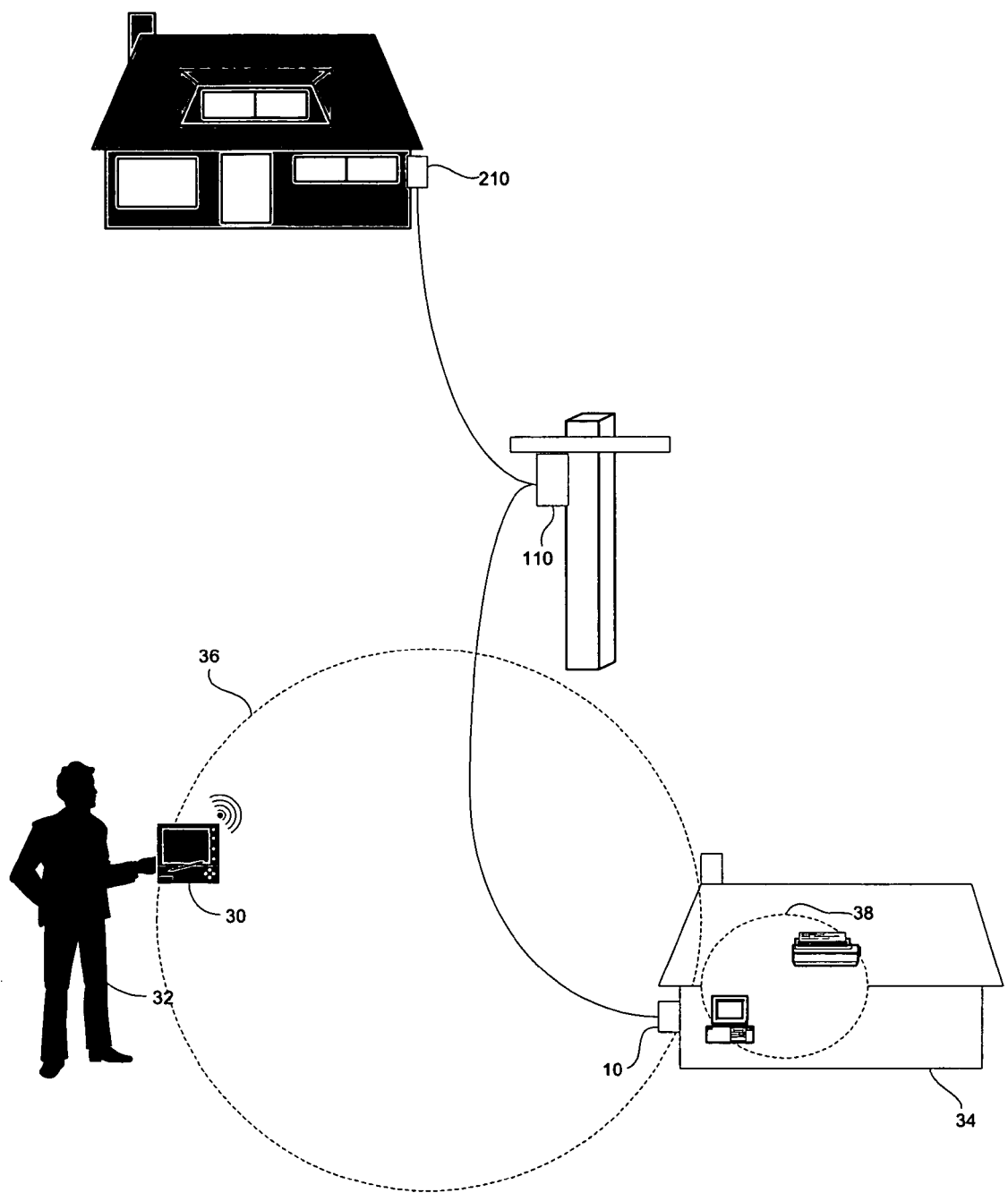
FIG. 2 is a system for wirelessly reading at least one meter according to an embodiment of the present disclosure.

Referring to FIG. 2, a system for wirelessly accessing at least one IED 10, 110, 210 is illustrated. In the system, reading personnel 32, e.g., a technician from a utility, is equipped with a Bluetooth-enabled device 30 for accessing data in the IED. The device 30 may be a laptop computer, a PDA, a mobile phone, etc. When device 30 comes within range of at least one of the IEDs, the device 30 and at least one IED 10 auto-negotiates and forms a network, e.g., a piconet 36. Preferably, the at least one IED 10 includes an address established by the utility so the device 30 knows the IED 10 is a meter to be read. Once the piconet 36 is established, the device 30 will ignore signals from other piconets, e.g., a piconet 38 established between a Bluetooth-enabled computer and Bluetooth-enabled printer within the home 34. As the device 30 comes with range of the other IEDs 110, 210, the device 30 will auto-negotiate with each of these IEDs 110, 210 and add them to the established piconet 36. Once connected to the piconet 36, the device 30 will receive data, e.g., energy consumption, from each IED without physically connecting to each device 10, 110, 210 or getting close enough to the device to read face-to-face. In this manner, reading personnel 32 may read a plurality of the IEDs by simply walking within an established range of each IED. Furthermore, in a residential application where a series of homes are located along a street, the reading personnel may simply drive along the street with a Bluetooth-enabled device in the vehicle and read a large number of IEDs rapidly.

In another embodiment, the IED may include a separate power supply (not shown) for supplying power to the transceiver 26 at a level other than the power level supplied by power supply 20. It is to be appreciated that increasing the power output level of the transceiver 26 will increase its communication range. The transceiver power supply may be a variable power supply enabling each IED to have a settable transmission range.

It is to be appreciated that the transceiver 26 will employ authentication and encryption for securely transmitting data and preventing tampering. It is also to be appreciated that the IEDs will employ SCO (synchronous connection oriented) type data transmission so in addition to transmitting data from the IED, the IED will be able to receive data from a Bluetooth-enabled device, e.g., to receive a software upgrade. In other embodiments, the transceiver 26 will also employ ACL (asynchronous connectionless) type data transfer.

In a further embodiment of the present disclosure, a system for retrieving revenue metering data from a plurality of IEDs, revenue meters, is provided. In this embodiment, reading device 30 is configured as a data collection device or mobile billing device (MBD). The mobile billing device will retrieve revenue metering data from a plurality of Bluetooth-enabled IEDs configured in accordance with the present disclosure. The mobile billing device will contain a computer processing module, e.g., a microprocessor that will use computer software instructions that have been programmed into the module and conventional computer processing power to interact and organize the traffic flow between various other modules, e.g., a memory module, communications module, etc. The mobile billing device also includes an operating system and micro instruction code preferably residing in read only memory (ROM) (not shown). The various processes and functions described herein may either be part of the micro instruction code or part of an application program (or a combination thereof) which is executed via the operating system. Exemplary operating systems include but are not limited to SymbianOS, Windows Mobile/Windows CE, Palm OS, Linux, Blackberry OS, BREW, etc. which have been developed for mobile computing applications and can handle both data computing and communication applications, e.g., voice communications.

Figure 3:
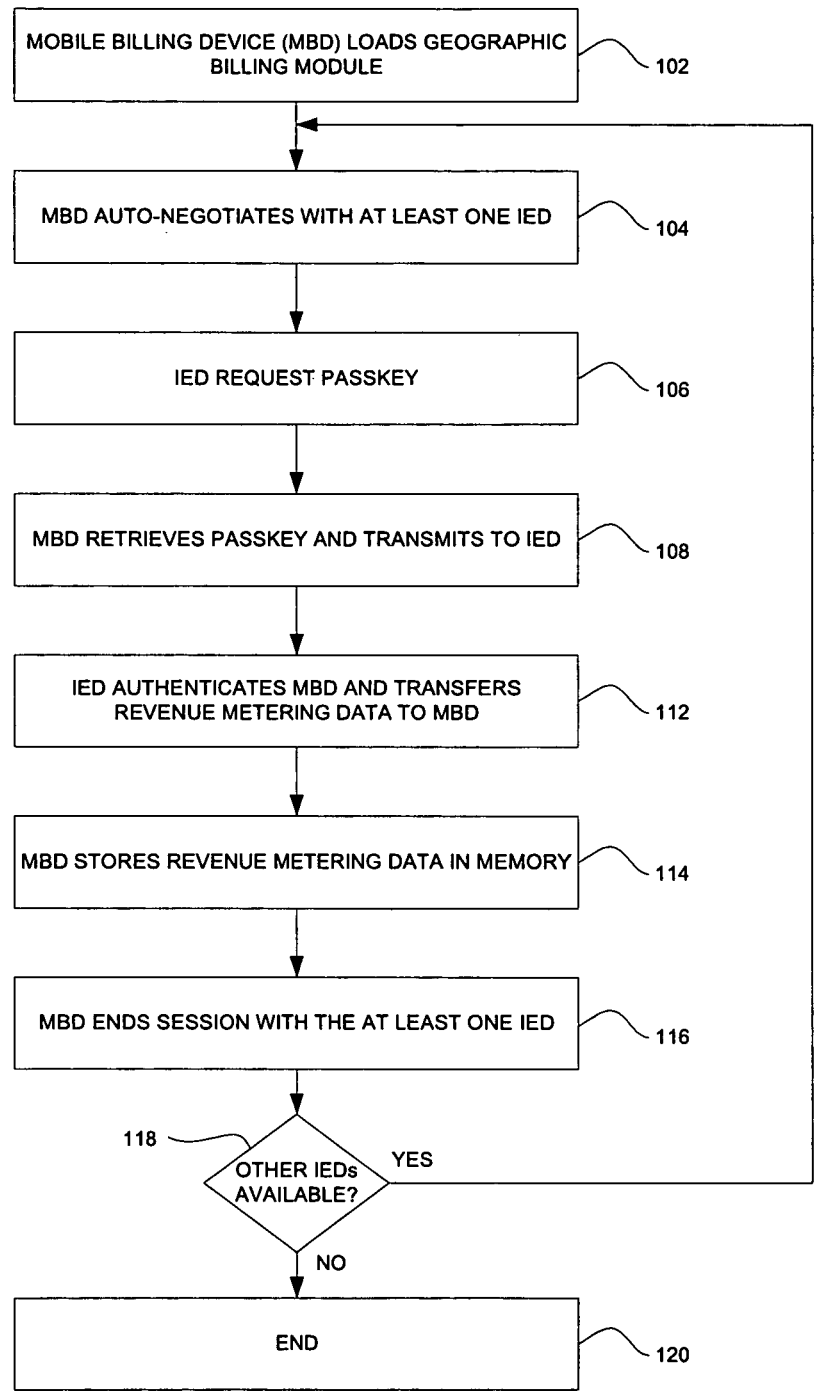
FIG. 3 is a flow chart illustrating a method for collecting revenue metering data from a plurality of intelligent electronic devices in accordance with the present disclosure.
Figure 4:
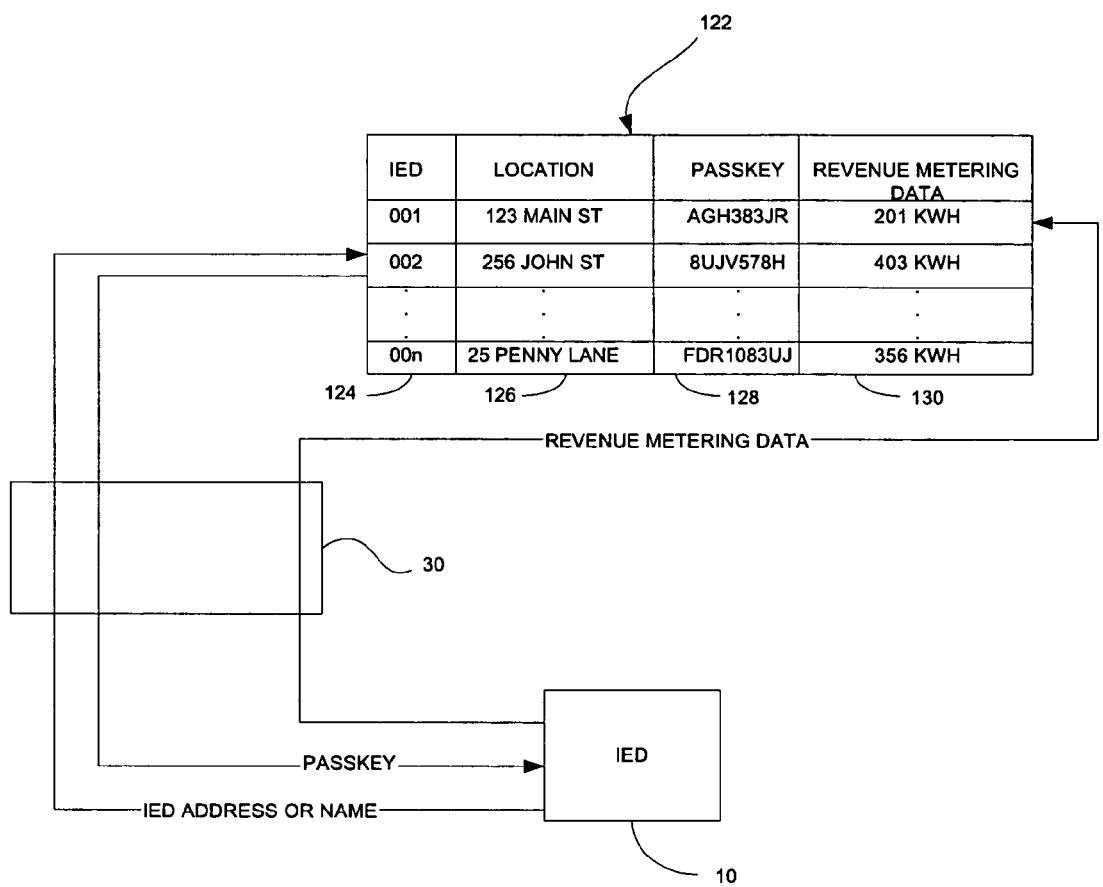
FIG. 4 is illustrates the overall flow of data in a system for retrieving revenue metering data from a plurality of IEDs in accordance with the present disclosure.

Referring to FIGS. 3 and 4, the system for retrieving revenue metering data from a plurality of IEDs will be described. It is to be appreciated that under the Bluetooth protocol pairs of devices, e.g., an IED 10 and mobile billing device 30, may establish a trusted relationship by learning (e.g., by user input) a shared secret known as a "passkey". A device that wants to communicate only with a trusted device can cryptographically authenticate the identity of the other device. Trusted devices may also encrypt the data that they exchange over the air so that no one can listen in. The encryption can however be turned off and passkeys are stored on the device's file system and not the Bluetooth transceiver itself. Since a Bluetooth address is permanent, a pairing will be preserved even if the Bluetooth name is changed. Devices will generally require pairing or will prompt the user before it allows a remote device to use any or most of its services.

Initially, in step 102, the mobile billing device (MBD) 30 will load a billing module 122 corresponding to a particular geographic location. The billing module 122 will include a database having a plurality of records relating to IEDs 10 in a known location. The database of the billing module will include but is not limited to data such as an IED identifier 124, e.g., an address or name of the IED, a location 126 of the IED, a passkey 128 associated with the IED and a record field 130 for storing revenue metering data relating to an IED.

Once the billing module is loaded, an operator of the MBD 30, e.g., a meter reader, will come into close proximity with at least one IED 10 to auto-negotiate with the IED 10 (step 104). Once a communication session is open, the IED 10 will request a passkey to determine if a valid pairing was established (step 106). Based on the IED identifier, e.g., an address or name of the IED, the MBD 30 will retrieve a passkey 128 associated with the IED identifier 124 and transmit the passkey to the IED (step 108). The IED 10 will then authenticate the MBD 30 and transfer the revenue billing data stored in memory, e.g., memory 22, to the MBD 30 (step 112). The MBD 30 will then store the revenue metering data in the billing module 122 in the record field 130.

In step 116, the MBD 30 will end the session with the IED and will determine if any other IEDs are available (step 118). If other IEDs are available, the MBD 30 will process the other IEDs by repeating the above described process from step 104; otherwise, the process will end in step 120.

By using the above described system and method of the present disclosure, a utility operator can retrieve revenue meter information from a large number of end users, e.g., residential consumer, by simply coming into close proximity of each IED without making direct physical contact or being close enough to the IED to read information from its display or interface. In this manner, a large number of IEDs can be read in a relatively short period of time.

Figure 5:
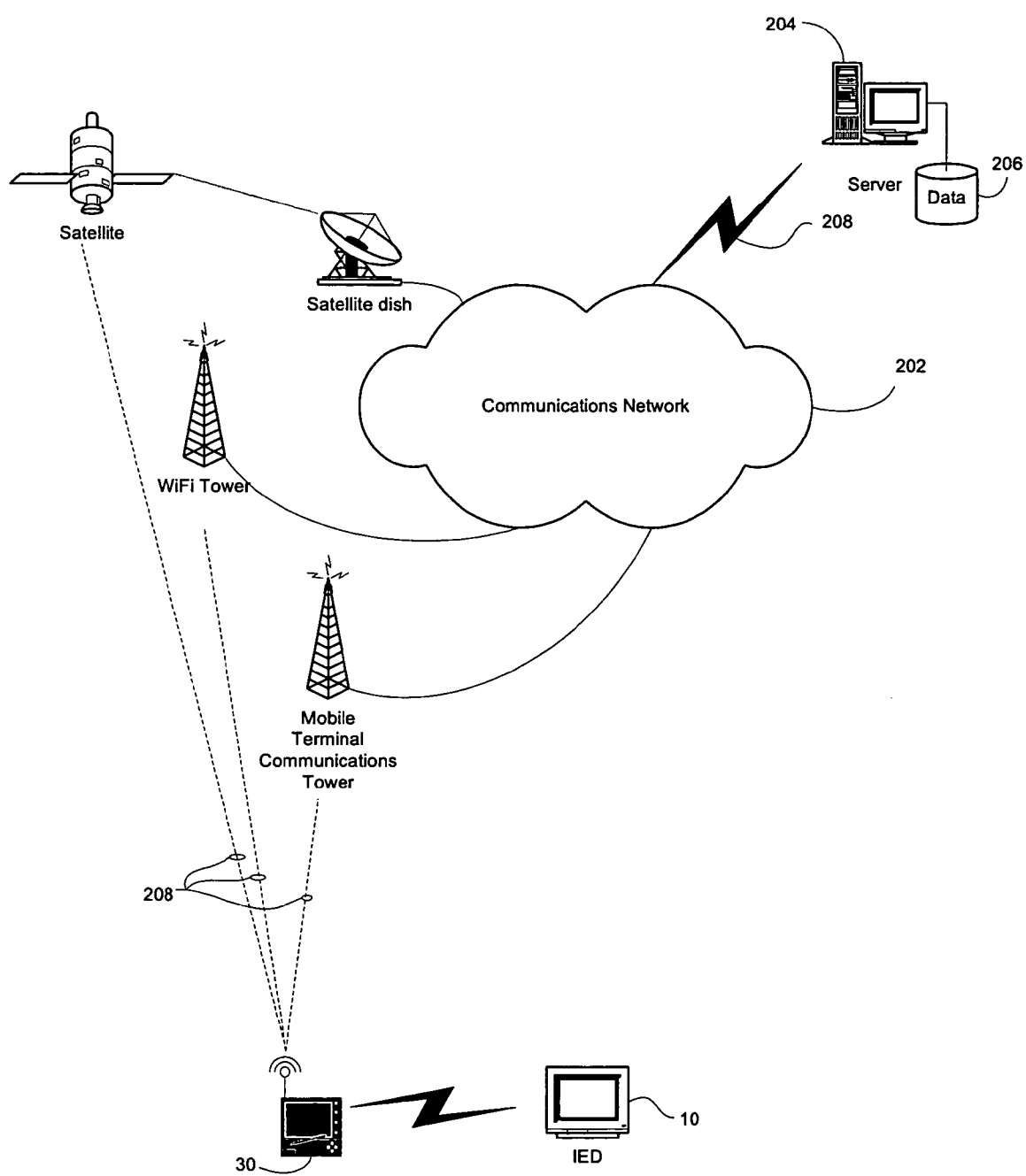
FIG. 5 is a system for wirelessly reading at least one meter according to another embodiment of the present disclosure.

It is to be appreciated that the data collected in the billing module 122 can then be uploaded to a computer and manipulated to create invoices for individual end users. The MBD 30 will upload the collected data by hardwired synchronization with the computer and/or upload the collected data to a remote server 204 over a communications network 202, e.g., the Internet, by any known means, for example, a hardwired or wireless connection, such as dial-up, hardwired, cable, DSL, satellite, cellular, PCS, wireless transmission (e.g., 802.11a/b/g), etc., as shown in FIG. 5. It is to be appreciated that the network 202 may be a local area network (LAN), wide area network (WAN), the Internet or any known network that couples a plurality of computers to enable various modes of communication via network messages. Furthermore, the server and MBD 30 will communicate using the various known protocols 208 such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc. In another embodiment, the MBD 20 will operate on the wireless GPRS (General Packet Radio Service) data protocol or a 3G protocol such as W-CDMA, CDMA2000 and TD-SCDMA, both of which have the ability to carry both voice and data over the same service. Once uploaded, the data collected from the IEDs may be stored in database 206 at the remote server 204.

In another embodiment, a meter reading device 30 is configured as a mobile communications terminal, e.g., a cellular phone or cellular phone enabled PDA, to automatically e-mail to a secure e-mail server 204 (e.g., POP3 server) or other e-mail infrastructure all revenue data, memory and other diagnostic or power quality data of the utility meter upon wirelessly reading the meter or IED. Using this system, the utility will have the data transmitted contemporaneously from the meter being read. The technology will significantly reduce man hours in transferring data and will allow the data to be sent automatically even when there is no dedicated infrastructure such as WIFI or WAN available.

While the disclosure has been shown and described with reference to certain preferred embodiments thereof, it will be understood by those skilled in the art that various changes in form and detail may be made therein without departing from the spirit and scope of the disclosure.

What is claimed is:

1. An intelligent electronic device comprising:
at least one sensor coupled to an electrical circuit configured for measuring at least one power parameter of the electrical circuit and generating at least one analog signal indicative of the at least one power parameter;
at least one analog to digital converter coupled to the at least one sensor configured for receiving the at least one analog signal and converting the at least one analog signal to at least one digital signal;
a processor configured for receiving the at least one digital signal and calculating energy consumption data in the electrical circuit;
a transceiver configured for receiving the calculated energy consumption data from the processor and wirelessly transmitting the calculated energy consumption data via a spread-spectrum frequency hopping technique to a portable remote reading device, wherein the portable remote reading device is configured to be carried throughout a particular geographical area and wirelessly communicate with a plurality of intelligent electronic devices located within the particular geographical area, wherein the portable remote reading device is further configured to store records related to the plurality of intelligent electronic devices in the particular geographical area, wherein the stored records comprise a plurality of different identifiers, a plurality of different locations, and a plurality of different passkeys, each one of the identifiers identifying a specific one of the plurality of intelligent electronic devices, each one of the locations associated with a specific one of the plurality of intelligent electronic devices, and each one of the passkeys associated with a specific one of the plurality of intelligent electronic devices, wherein each intelligent electronic device has a passkey that is different from the other passkeys, wherein the transceiver is further configured to transmit the calculated energy consumption data to the portable remote reading device in response to the portable remote reading device transmitting the passkey corresponding with the respective intelligent electronic device to the transceiver, and wherein the transceiver is further configured to wirelessly receive upgrade data from the portable remote reading device by a synchronous connection oriented (SCO) type data transmission, the upgrade data enabling the processor to upgrade software on the intelligent electronic device; and
a cryptographic module configured for establishing a secure wireless communication channel with the portable remote reading device, wherein the cryptographic module auto-negotiates with the portable remote reading device to allow communication between the intelligent electronic device and the portable remote reading device, wherein the cryptographic module is further configured to request a respective passkey associated with the intelligent electronic device and establish the secure wireless communication channel with the portable remote reading device after receiving the respective passkey from the portable remote reading device, and wherein the secure wireless communication channel enables the wireless transmission of the calculated energy consumption data and wireless receipt of upgrade data.

2. The intelligent electronic device as in claim 1, further comprising a memory for storing at least one protocol stack for enabling the spread-spectrum frequency hopping technique.

3. The intelligent electronic device as in claim 2, wherein the at least one protocol stack is a Bluetooth protocol stack.

4. The intelligent electronic device as in claim 1, wherein the transceiver transmits on a frequency of about 2.45 gigahertz.

5. The intelligent electronic device as in claim 1, wherein the transceiver transmits on a frequency of about 2.402 GHz to about 2.480 GHz.

6. The intelligent electronic device as in claim 1, wherein the cryptographic module is further configured for encrypting the calculated energy consumption data.

7. The intelligent electronic device as in claim 1, wherein the processor initiates transmission of data in response to receiving the respective passkey.

8. The intelligent electronic device as in claim 1, further comprising means for supplying a variable output power to the transceiver, wherein the variable output power is adjustable to allow a communication range of the transceiver to be varied.

9. The intelligent electronic device as in claim 6, wherein the cryptographic module encrypts the calculated energy consumption data using at least one of the security protocols comprising checksum, Data Encryption Standard (DES), Elliptical Curve Encryption (ECC), International Data Encryption Algorithm (IDEA), Message Digest 5 (MD5), Rivest Cipher, Rivest Shamir Adleman (RSA), Rijndael, Secure Hash Algorithm (SHA), Secure Socket Layer (SSL), and Secure Hypertext Transfer Protocol (HTTPS).

10. A system for collecting data from at least one intelligent electronic device, the system comprising:
   a plurality of intelligent electronic devices located within a particular geographic area, each intelligent electronic device comprising:
      at least one sensor coupled to an electrical circuit configured for measuring at least one power parameter of the electrical circuit and generating at least one analog signal indicative of the at least one power parameter;
      at least one analog to digital converter coupled to the at least one sensor configured for receiving the at least one analog signal and converting the at least one analog signal to at least one digital signal;
      a processor configured for receiving the at least one digital signal and calculating energy consumption data in the electrical circuit;
      a transceiver configured for receiving the calculated energy consumption data from the processor and wirelessly transmitting the calculated energy consumption data via a spread-spectrum frequency hopping technique; and
      a memory for storing an identifier and a passkey, wherein the identifiers and passkeys are different for each of the plurality of intelligent electronic devices; and
   a portable data collection device configured to store the identifier and the passkey associated with each of the plurality of intelligent electronic devices, the portable data collection device further configured for establishing a piconet with one or more of the plurality of intelligent electronic devices located within the particular geographical area, wirelessly receiving an identifier from each of the one or more intelligent electronic devices identifying the one or more intelligent electronic devices with which a piconet is established, retrieving a corresponding passkey for each of the one or more intelligent electronic devices based on the identifier received from each of the one or more intelligent electronic devices, wirelessly transmitting the corresponding passkey to each respective one of the one or more intelligent electronic devices, and wirelessly receiving the calculated energy consumption data from the one or more intelligent electronic devices via the spread-spectrum frequency hopping technique;
   wherein the portable data collection device is further configured to upload the received energy consumption data associated with the one or more of the at least one intelligent electronic device to a server; and
   wherein each transceiver is further configured to wirelessly receive upgrade data from the portable data collection device by a synchronous connection oriented (SCO) type data transmission, the upgrade data enabling the respective processor to upgrade software on the respective intelligent electronic device.

11. The system as in claim 10, wherein each of the plurality of intelligent electronic devices auto-negotiates with the portable data collection device.

12. The system as in claim 11, wherein the portable data collection device further comprises a billing module configured to store the received calculated energy consumption data for each of the one or more intelligent electronic devices.

13. The system as in claim 12, wherein the billing module is further configured to store the identifier and passkey associated with each of the plurality of intelligent electronic devices.

14. The system as in claim 10, wherein the portable data collection device transmits the received calculated energy consumption data to the server by e-mail.

15. The system as in claim 10, wherein the memory of each of the plurality of intelligent electronic devices is further configured for storing at least one protocol stack for enabling the spread-spectrum frequency hopping technique.

16. The system as in claim 15, wherein the at least one protocol stack is a Bluetooth protocol stack.

17. The system as in claim 10, wherein the transceiver transmits on a frequency of about 2.402 GHz to about 2.480 GHz.

18. The system as in claim 10, wherein each of the plurality of intelligent electronic devices further comprises a cryptographic module configured for encrypting the calculated energy consumption data.

19. The system as in claim 10, further comprising means for supplying a variable output power to the transceiver, wherein the variable output power is adjustable to allow a transmission range of the transceiver to be varied.

20. The system as in claim 10, wherein the portable data collection device is further configured to wirelessly transmit upgrade data to the one or more intelligent electronic devices via a synchronous connection oriented (SCO) type data transmission.

* * * * *